US009543342B2

(12) United States Patent
Tsukimura

(10) Patent No.: US 9,543,342 B2
(45) Date of Patent: Jan. 10, 2017

(54) SOLID-STATE IMAGING DEVICE

(71) Applicant: OLYMPUS CORPORATION, Tokyo (JP)

(72) Inventor: Mitsuhiro Tsukimura, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 14/706,672

(22) Filed: May 7, 2015

(65) Prior Publication Data

US 2015/0326837 A1 Nov. 12, 2015

(30) Foreign Application Priority Data

May 8, 2014 (JP) .................... 2014-097010

(51) Int. Cl.
*H01L 27/146* (2006.01)
*H04N 5/232* (2006.01)
*H04N 9/04* (2006.01)

(52) U.S. Cl.
CPC ..... *H01L 27/1461* (2013.01); *H01L 27/14636* (2013.01); *H01L 27/14638* (2013.01); *H01L 27/14645* (2013.01); *H04N 5/23212* (2013.01); *H04N 9/045* (2013.01); *H01L 27/14621* (2013.01); *H01L 27/14627* (2013.01)

(58) Field of Classification Search
CPC .......... H04N 5/232; H04N 9/04; H04N 9/045; H04N 5/23212; H04N 5/347; H04N 5/3537; H04N 5/3742; H04N 5/365; H01L 27/1461; H01L 27/14638; H01L 27/14645; H01L 27/14636; H01L 27/14621; H01L 27/1462; H01L 27/14627
See application file for complete search history.

(56) References Cited

U.S. PATENT DOCUMENTS

| 2006/0023094 | A1* | 2/2006 | Yokoyama | ........ H01L 27/14621 348/273 |
| 2008/0068475 | A1* | 3/2008 | Choe | ................. G06T 3/4015 348/273 |
| 2008/0246853 | A1* | 10/2008 | Takizawa | .......... H01L 27/14621 348/222.1 |
| 2011/0032376 | A1* | 2/2011 | Takizawa | .......... H01L 27/14627 348/222.1 |

(Continued)

FOREIGN PATENT DOCUMENTS

JP 2013-247548 12/2013

*Primary Examiner* — Roberto Velez
*Assistant Examiner* — Tuan Le
(74) *Attorney, Agent, or Firm* — Pillsbury Winthrop Shaw Pittman, LLP

(57) ABSTRACT

A plurality of first pixels P1 corresponding to color filters of two or more colors constitute a pixel group. A plurality of the pixel groups are arranged so that each of the pixel groups corresponds to one of second pixels P2. The light which is transmitted through the color filters enters first photoelectric conversion units of the first pixels P1 corresponding to the color filters. The light which is transmitted through the pixel group enters a second photoelectric conversion unit of the second pixel P2 corresponding to the pixel group. The number of colors of the color filters corresponding to the plurality of first pixels P1 that constitute the pixel group, and the number of the first pixels P1 corresponding to each color are equal to each other among the plurality of pixel groups.

3 Claims, 7 Drawing Sheets

(56) References Cited

U.S. PATENT DOCUMENTS

| | | | |
|---|---|---|---|
| 2013/0240708 A1* | 9/2013 | Kokubun | H01L 31/02162 250/208.1 |
| 2014/0306276 A1* | 10/2014 | Yamaguchi | H01L 27/1464 257/292 |
| 2015/0091115 A1* | 4/2015 | Lin | H01L 27/1463 257/432 |
| 2015/0146056 A1* | 5/2015 | Hirota | H04N 5/23212 348/294 |

* cited by examiner

SOLID-STATE IMAGING DEVICE

BACKGROUND OF THE INVENTION

Field of the Invention

The present invention relates to a solid-state imaging device having a plurality of substrates.

Priority is claimed on Japanese Patent Application No. 2014-097010, filed on May 8, 2014, the contents of which are incorporated herein by reference.

Description of Related Art

Solid-state imaging devices having a plurality of substrates have been disclosed. For example, Japanese Unexamined Patent Application, First Publication No. 2013-247548 discloses a solid-state imaging device having a first substrate in which photoelectric transducers for imaging signals are arranged, and a second substrate in which photoelectric transducers for auto-focusing are arranged. An auto-focusing operation is attained by processing signals based on signal charges generated by the photoelectric transducers arranged in the second substrate.

SUMMARY OF THE INVENTION

A first aspect of the present invention is a solid-state imaging device including a first substrate configured such that a plurality of first pixels having first photoelectric conversion units are arranged in a two-dimensional matrix; a second substrate configured such that a plurality of second pixels having second photoelectric conversion units are arranged in a two-dimensional matrix; and a plurality of color filters arranged corresponding to each of the first pixels. A plurality of the first pixels corresponding to the color filters of two or more colors constitute a pixel group. A plurality of the pixel groups are arranged so that each of the pixel groups corresponds to the second pixels. A light which is transmitted through the color filters enters the first photoelectric conversion units of the first pixels corresponding to the color filters. A light which is transmitted through the pixel group enters the second photoelectric conversion unit of the second pixel corresponding to the pixel group. The number of colors of the color filters corresponding to the plurality of first pixels that constitute the pixel group, and the number of the first pixels corresponding to each color are equal to each other among the plurality of pixel groups.

According to the solid-state imaging device related to a second aspect of the present invention based on the first aspect, the color filters may include R filters having a peak of transmittance in a red wavelength band; G filters having a peak of transmittance in a green wavelength band; and B filters having a peak of transmittance in a blue wavelength band. The pixel group may include two or more of the first pixels corresponding to the R filters.

According to the solid-state imaging device related to a third aspect of the present invention based on the second aspect, the R filters, the G filters, and the B filters may be arranged so as to constitute a Bayer array, and the pixel group may include only two of the first pixels corresponding to the R filters and one of the first pixels corresponding to the G filter.

According to the solid-state imaging device related to a fourth aspect of the present invention based on the first aspect, the color filters may include R filters having a peak of transmittance in a red wavelength band; G filters having a peak of transmittance in a green wavelength band; and B filters having a peak of transmittance in a blue wavelength band. The R filters, the G filters, and the B filters may be arranged so as to constitute a Bayer array. The pixel group may include one or more combinations of only one of the first pixels corresponding to one of the R filters included in a unit array of the Bayer array, two of the first pixels corresponding to two of the G filters included in the unit array of the Bayer array, and one of the first pixels corresponding to one of the B filters included in the unit array of the Bayer array.

DETAILED DESCRIPTION OF THE INVENTION

Figure 1:
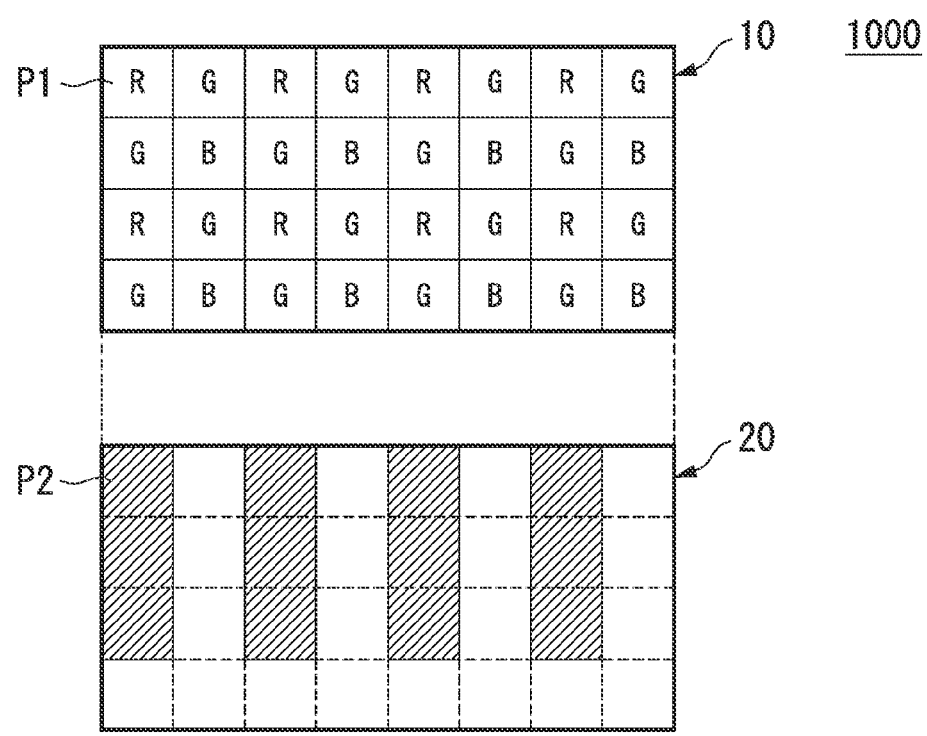
FIG. 1 is a plan view illustrating a configuration example of a solid-state imaging device according to a first embodiment of the present invention.

Embodiments of the present invention will be described below referring to the drawings.

First Embodiment

First, a first embodiment of the present invention will be described. FIG. 1 illustrates a configuration example of a solid-state imaging device 1000 according to the present embodiment. As illustrated in FIG. 1, the solid-state imaging device 1000 has a first substrate 10 and a second substrate 20. The first substrate 10 and the second substrate 20 overlap each other in a direction perpendicular to a principal surface of each substrate. The principal surface is the widest surface among a plurality of surfaces that constitute the surface of the substrate. A state where the first substrate 10 and the second substrate 20 are seen in the direction perpendicular to the principal surface of each substrate is illustrated in FIG. 1.

The first substrate 10 has a plurality of first pixels P1. The plurality of first pixels P1 are arranged in a two-dimensional matrix. In FIG. 1, thirty-two first pixels P1 of four rows and eight columns are arranged. The number of the first pixels P1 may be greater than or smaller than 32. A plurality of color filters are arranged corresponding to each of the first pixels P1. Any one of an R filter, a G filter, and a B filter is arranged on the surface of a first pixel P1. The R filter is a filter corresponding to "R" that is red, and has a peak of transmittance in a wavelength band of "R" that is red. The G filter is a filter corresponding to "G" that is green, and has a peak of transmittance in a wavelength band of "G" that is green. The B filter is a filter corresponding to "B" that is blue, and has a peak of transmittance in a wavelength band of "B" that is blue.

In FIG. 1, R filters are arranged on the surfaces of the first pixels P1 written as "R". Additionally, in FIG. 1, G filters are arranged on the surfaces of the first pixels P1 written as "G". Additionally, in FIG. 1, B filters are arranged on the surfaces of the first pixels P1 written as "B". An array of the plurality of color filters corresponding to the plurality of first pixels P1 constitutes a Bayer array in which one R filter, two G filters, and one B filter are a unit array. That is, in the first substrate 10, the R filters, the G filters, and the B filters are arranged so as to constitute the Bayer array.

As illustrated in FIG. 1, in the array of the plurality of first pixels P1, the first pixels P1 corresponding to the R filters and the first pixels P1 corresponding to the G filters are alternately and periodically arranged in a first row. Additionally, in the array of the plurality of first pixels P1, the first pixels P1 corresponding to the G filters and the first pixels P1 corresponding to the B filters are alternately and periodically arranged in a second row adjacent to the first row. Additionally, the first pixels P1 corresponding to the G filters are adjacent to the first pixels P1 corresponding to the R filters in a row direction, that is, a horizontal direction. Additionally, the first pixels P1 corresponding to the G filters are adjacent to the first pixels P1 corresponding to the B filters in the row direction, that is, the horizontal direction.

The second substrate 20 has a plurality of second pixels P2. The plurality of second pixels P2 are arranged in a two-dimensional matrix. In FIG. 1, four second pixels P2 of one row and four columns are arranged.

The number of the second pixels P2 may be greater than or smaller than 4. In the second substrate 20, regions illustrated by dashed lines are equivalent to regions where the first pixels P1 are arranged in the first substrate 10.

A plurality of, that is, two or more of the first pixels P1 corresponding to the color filters of two or more colors among the plurality of first pixels P1 arranged on the first substrate 10 constitute a pixel group. All the first pixels P1 that constitute one pixel group are adjacent to any of the other first pixels P1 belonging to the same pixel group. The one pixel group includes two or more of the first pixels P1 corresponding to R filters.

In the solid-state imaging device 1000, three first pixels P1 that are consecutive in a column direction, that is, a vertical direction, constitute the pixel group. Specifically, two first pixels P1 corresponding to R filters and one first pixel P1 corresponding to a G filter constitute the pixel group. In other words, the pixel group includes only two first pixels P1 corresponding to R filters and one first pixel P1 corresponding to a G filter.

A plurality of the pixel groups are arranged so that each of the pixel groups corresponds to one of the second pixels P2. In FIG. 1, four pixel groups corresponding to the four second pixels P2 are arranged. A second pixel P2 is arranged corresponding to a set of the plurality of first pixels P1 that constitute the pixel group.

The number of colors of the color filters corresponding to the plurality of first pixels P1 that constitute the pixel group, and the number of the first pixels P1 corresponding to each color are equal to each other among the plurality of pixel groups. In the solid-state imaging device 1000, the colors of color filters corresponding to the plurality of first pixels P1 that constitute the pixel group are R, that is, red and G, that is, green. That is, even in any of the pixel groups, the number of colors of color filters corresponding to the plurality of first pixels P1 that constitute the pixel group is two. Additionally, in any of the pixel groups, the number of first pixels P1 corresponding to R (that is red) is two, and the number of first pixels P1 corresponding to green (that is G) is two.

Figure 2:
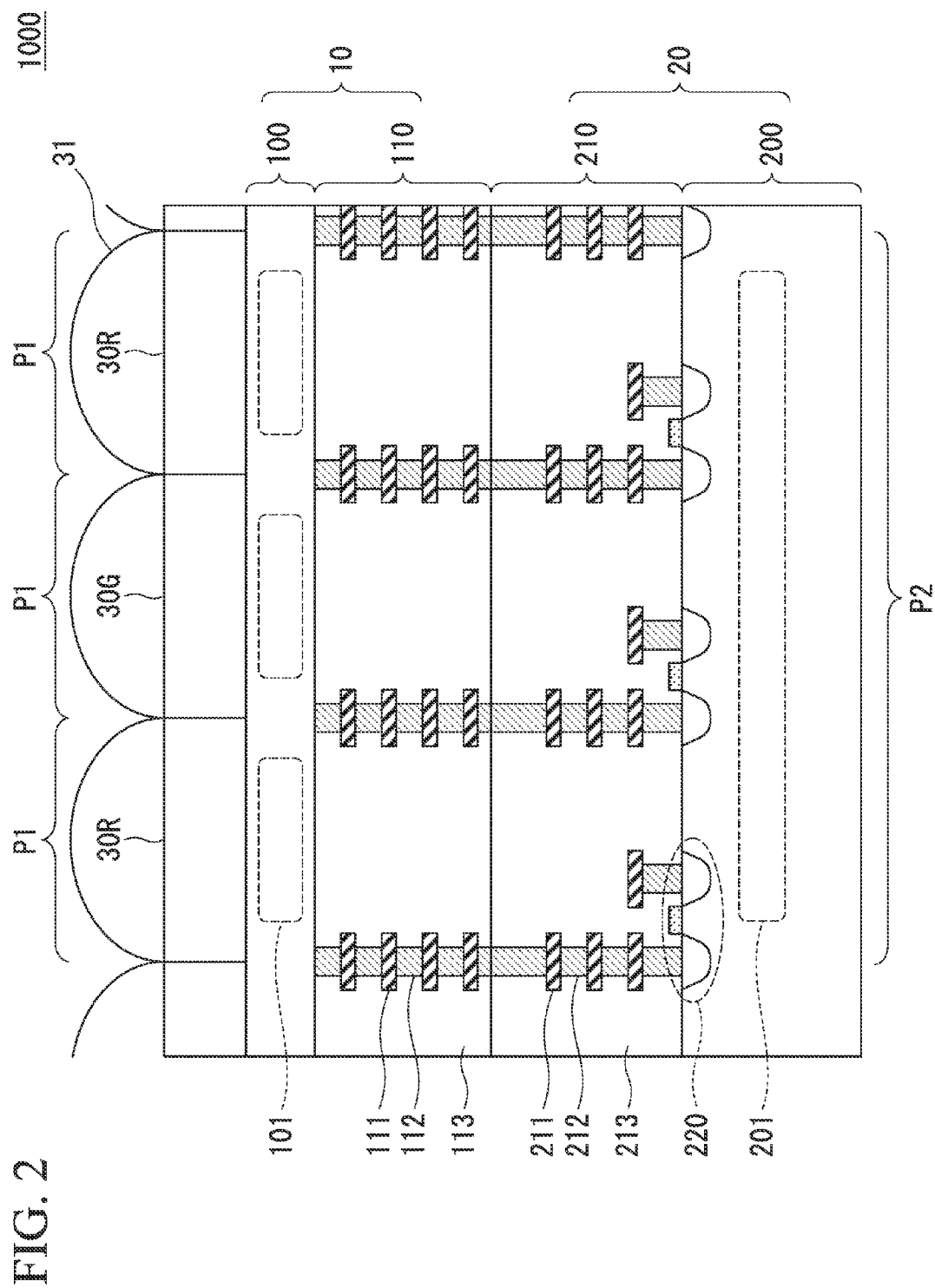
FIG. 2 is a cross-sectional view illustrating the configuration example of the solid-state imaging device according to the first embodiment of the present invention.

FIG. 2 illustrates a configuration example of a cross-section of the solid-state imaging device 1000. As illustrated in FIG. 2, the solid-state imaging device 1000 has the first substrate 10, the second substrate 20 laminated on the first substrate 10, color filters 30R and a color filter 30G that are formed on the surface of the first substrate 10, and microlenses 31 arranged corresponding the color filters 30R and the color filter 30G. The thicknesses and widths of portions that constitute the solid-state imaging device 1000 do not necessarily follow the thicknesses and widths that are illustrated in FIG. 2. The thicknesses and widths of the portions that constitute the solid-state imaging device 1000 may be arbitrary.

The first substrate 10 has a first semiconductor layer 100 and a first wiring layer 110. The first semiconductor layer 100 and the first wiring layer 110 overlap each other in the direction perpendicular to the principal surface of the first substrate 10. Additionally, the first semiconductor layer 100 and the first wiring layer 110 come in contact with each other.

The first semiconductor layer 100 has a first photoelectric conversion unit 101. Although a plurality of the first photoelectric conversion units 101 are present in FIG. 2, a reference sign of one first photoelectric conversion unit 101 is representatively illustrated. The first semiconductor layer 100 is made of materials including semiconductors, such as silicon (Si). The first semiconductor layer 100 has a first surface and a second surface. The first surface comes in contact with the first wiring layer 110. The second surface comes in contact with the color filters 30R and the color filter 30G. The second surface is opposite to the first surface. The second surface of the first semiconductor layer 100 constitutes one of the principal surfaces of the first substrate 10. The light entering the second surface of the first semiconductor layer 100, proceeds into the first semiconductor layer 100 and enters the first photoelectric conversion units 101.

The first photoelectric conversion units 101 are made of, for example, semiconductor materials having an impurity concentration that is different from that of the semiconductor materials that constitute the first semiconductor layer 100. The first photoelectric conversion units 101 generate signal charges according to the amount of light incident on the first photoelectric conversion units 101. When the first substrate 10 or the second substrate 20 is seen in the direction perpendicular to each principal surface (that is, when the first substrate 10 or the second substrate 20 is planarly seen), the plurality of first photoelectric conversion units 101 are arranged in a two-dimensional matrix.

The first wiring layer 110 has a first wiring line 111, a first via 112, and a first interlayer insulation film 113. Although a plurality of the first wiring lines 111 are present in FIG. 2, a reference sign of one first wiring line 111 is representatively illustrated. Additionally, although a plurality of the first vias 112 are present in FIG. 2, a reference sign of one first via 112 is representatively illustrated.

The first wiring lines 111 are made of materials (for example, metal, such as aluminum (Al) or copper (Cu)) having conductivity. The first wiring layer 110 has a first surface that comes in contact with the second substrate 20, and a second surface that comes in contact with the first semiconductor layer 100 and is opposite to the first surface. The first surface of the first wiring layer 110 constitutes one of the principal surfaces of the first substrate 10.

The first wiring lines 111 are thin films on which wiring patterns are formed. The first wiring lines 111 transmit signal charges for imaging signals, which are generated by the first photoelectric conversion units 101, and other signals (a power source voltage, a ground voltage, or the like). A first wiring line 111 of only one layer may be formed, and first wiring lines 111 of two or more layers may be formed. In FIG. 2, first wiring lines 111 of four layers may be formed.

The first vias 112 are made of materials having conductivity. Each first via 112 connects first wiring lines 111 of different layers. In the first wiring layer 110, portions other than the first wiring lines 111 and the first vias 112 are constituted of the first interlayer insulation film 113 formed of silicon dioxide (SiO2) or the like.

The second substrate 20 has a second semiconductor layer 200 and a second wiring layer 210. The second semiconductor layer 200 and the second wiring layer 210 overlap each other in the direction perpendicular to the principal surface of the second substrate 20. Additionally, the second semiconductor layer 200 and the second wiring layer 210 come in contact with each other.

The second semiconductor layer 200 has a second photoelectric conversion unit 201. The second semiconductor layer 200 is made of materials including semiconductors, such as silicon (Si). The second photoelectric conversion unit 201 is made of, for example, semiconductor materials having an impurity concentration that is different from that of the semiconductor materials that constitute the second semiconductor layer 200. The second photoelectric conversion unit 201 is formed in a region corresponding to the first photoelectric conversion units 101. The second wiring layer 210 has a first surface that comes in contact with the second semiconductor layer 200, and a second surface that is opposite to the first surface. The second surface of the second semiconductor layer 200 constitutes one of the principal surfaces of the second substrate 20. The light, which entered the first surface of the second semiconductor layer 200, proceeds into the second semiconductor layer 200 and enters the second photoelectric conversion unit 201. The second photoelectric conversion unit 201 generates a signal charge according to the amount of light that has entered therein.

The solid-state imaging device 1000 has a plurality of the second photoelectric conversion units 201. One second photoelectric conversion unit 201 is representatively illustrated in FIG. 2. When the first substrate 10 or the second substrate 20 is seen in the direction perpendicular to each principal surface (that is, when the first substrate 10 or the second substrate 20 is planarly seen), the plurality of second photoelectric conversion units 201 are arranged in a two-dimensional matrix.

The second wiring layer 210 has a second wiring line 211, a second via 212, a second interlayer insulation film 213, and an MOS transistor 220. Although a plurality of the second wiring lines 211 are present in FIG. 2, a reference sign of one second wiring line 211 is representatively illustrated. Additionally, although a plurality of the second vias 212 are present in FIG. 2, a reference sign of one second via 212 is representatively illustrated. Additionally, although a plurality of the MOS transistors 220 are present in FIG. 2, a reference sign of one MOS transistor 220 is representatively illustrated.

The second wiring lines 211 are made of materials (for example, metal, such as aluminum (Al) or copper (Cu)) having conductivity. The second wiring layer 210 has a first surface that comes in contact with the first wiring layer 110, and a second surface that comes in contact with the second semiconductor layer 200 and is opposite to the first surface. The first surface of the second wiring layer 210 constitutes one of the principal surfaces of the second substrate 20.

The second wiring lines 211 are thin films on which wiring patterns are formed. The second wiring lines 211 transmit signal charges for imaging signals, which are generated by the first photoelectric conversion units 101, a signal charge for auto-focusing, which is generated by the second photoelectric conversion unit 201, and other signals (a power source voltage, a ground voltage, or the like). A second wiring line 211 of only one layer may be formed, and second wiring lines 211 of two or more layers may be formed. In the example illustrated in FIG. 2, second wiring lines 211 of three layers are formed.

The second vias 212 are made of materials having conductivity. Each second via 212 connects second wiring lines 211 of different layers. In the second wiring layer 210, portions other than the second wiring lines 211 and the second vias 212 are constituted of the second interlayer insulation film 213 formed of silicon dioxide (SiO2) or the like.

Each MOS transistor 220 has a source region and a drain region that are diffusion regions formed in the second semiconductor layer 200, and a gate electrode formed in the second wiring layer 210.

The source region and the drain region are connected together by a second via 212. The gate electrode is arranged between the source region and the drain region. The MOS transistor 220 processes a signal transmitted by second wiring lines 211 and a second via 212.

The first substrate 10 and the second substrate 20 are connected together in a state where the first wiring layer 110 of the first substrate 10 and the second wiring layer 210 of the second substrate 20 face each other. The first vias 112 of the first wiring layer 110 and the second vias 212 of the second wiring layer 210 are electrically connected together in the interface between the first substrate 10 and the second substrate 20.

The color filters 30R and the color filter 30G are arranged in the second surface of the first semiconductor layer 100. The color filters 30R are R filters. Additionally, the color filter 30G is a G filter. The microlenses 31 are arranged corresponding to the color filters 30R and the color filter 30G. Although a plurality of microlenses 31 are present in FIG. 2, a reference sign of one microlens 31 is representatively illustrated.

In FIG. 2, a configuration of the region corresponding to one pixel group is illustrated. As illustrated in FIG. 2, in the first substrate 10, one pixel group includes two first pixels P1 corresponding to the color filters 30R that are the R filters, and one first pixel P1 corresponding to the color filter 30G that is the G filter. Each of the first photoelectric conversion units 101 are arranged in each of the first pixels P1.

In the second substrate 20, the second pixel P2 is arranged in a region corresponding to the one pixel group. The second photoelectric conversion unit 201 is arranged in the second pixel P2.

The light transmitted through the color filters 30R and the color filter 30G enters the first photoelectric conversion units 101 of the first pixels P1 corresponding to the respective color filters. The light transmitted through the first photoelectric conversion units 101 of the same pixel group enters the second photoelectric conversion unit 201 of the second pixel P2 corresponding to the pixel group. In FIG. 2, the light, which has been transmitted through the first photoelectric conversion units 101 of the two first pixels P1 corresponding to the two color filters 30R, and the light, which has been transmitted through the first photoelectric conversion unit 101 of the one first pixel P1 corresponding to the one color filter 30G, enter the same second photoelectric conversion unit 201.

A first photoelectric conversion unit 101 arranged in one first pixel P1 may be split into a plurality of photoelectric conversion units. Signal charges generated by the plurality of first photoelectric conversion units 101 within the one first pixel P1 are finally output from the solid-state imaging device 1000 as a signal corresponding to the one first pixel P1. Similarly, the second photoelectric conversion unit 201 arranged in the one second pixel P2 may be split into a plurality of second photoelectric conversion units. Signal charges generated by the plurality of second photoelectric conversion units 201 within the one second pixel P2 are finally output from the solid-state imaging device 1000 as a signal corresponding to the one second pixel P2.

In FIG. 2, the microlenses 31, components other than the first photoelectric conversion units 101 in the first substrate 10, and components other than the second photoelectric conversion unit 201 in the second substrate 20 are not components that are indispensable in order to obtain the characteristic effects of the solid-state imaging device 1000.

According to the present embodiment, the solid-state imaging device 1000 is configured so as to have the first substrate 10 configured such that the plurality of first pixels P1 having the first photoelectric conversion units 101 are arranged in a two-dimensional matrix; the second substrate 20 configured such that the plurality of second pixels P2 having the second photoelectric conversion units 201 are arranged in a two-dimensional matrix; and the plurality of color filters (the color filters 30R and the color filters 30G) arranged corresponding to each of the first pixels P1. A plurality of the first pixels P1 corresponding to the color filters of two or more colors constitute a pixel group. A plurality of the pixel groups are arranged so that each of the pixel groups corresponds to one of the second pixels P2. The light transmitted through the color filters enters the first photoelectric conversion units 101 of the first pixels P1 corresponding to the color filters. The light transmitted through the pixel group enters the second photoelectric conversion unit 201 of the second pixel P2 corresponding to the pixel group. The number of colors of the color filters corresponding to the plurality of first pixels P1 that constitute the pixel group, and the number of the first pixels P1 corresponding to each color are equal to each other among the plurality of pixel groups.

Figure 11:
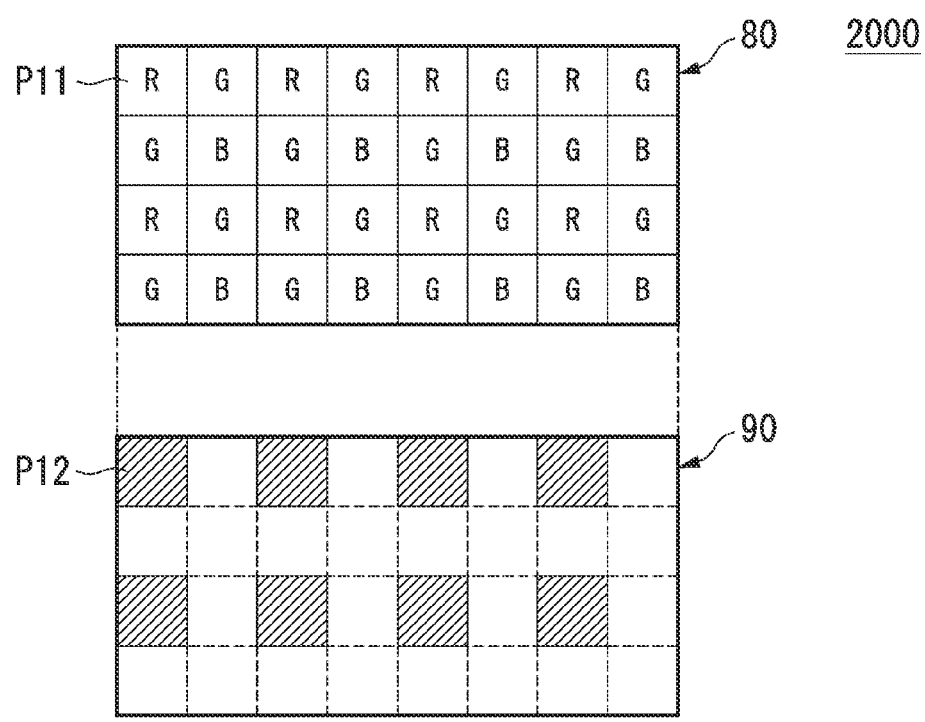
FIG. 11 is a plan view illustrating a configuration example of a solid-state imaging device having a plurality of substrates.

In the present embodiment, the light, which has been transmitted through the pixel group constituted of the plurality of first pixels P1 corresponding to the color filters of two or more colors, enters the second photoelectric conversion unit 201 of the second pixel P2 corresponding to the pixel group. Specifically, the light, which has been transmitted through a pixel group constituted of three first pixels P1 corresponding to two R filters and one G filter, enters the second photoelectric conversion unit 201 of one second pixel P2. For this reason, as illustrated in FIG. 11, as compared to a case where the light transmitted through a first pixel P11 corresponding to one R filter enters the second photoelectric conversion unit of one second pixel P12, the amount of the light incident on the second photoelectric conversion unit 201, increases relatively.

That is, since the signal charge generated from the second photoelectric conversion unit 201 increases relatively, the sensitivity of the second pixel P2 can be improved. Moreover, as the pixel group includes the two or more first pixels P1 corresponding to the R filters, the sensitivity of the second pixel P2 can be further improved.

Additionally, by changing the combination of the first pixels P1 that constitute the pixel group, it is possible to change a region where the second pixel P2 is arranged. Accordingly, the degree of freedom of the layout of the second pixel P2 can be improved. This specific example will be described in a modified example.

Additionally, the number of colors of the color filters corresponding to the plurality of first pixels P1 that constitute the pixel group, and the number of the first pixels P1 corresponding to each color are equal to each other among the plurality of pixel groups. That is, in any of the pixel groups, the combinations of the first pixels P1 when the colors of the color filters are take into consideration are equal to each other. Accordingly, the unevenness of the sensitivity between the plurality of second pixels P2 can be reduced.

Additionally, in the second substrate 20, wiring lines or the like can be arranged in regions where the second pixels P2 are not arranged. As illustrated in FIG. 1, when the pixel group includes only the two first pixels P1 corresponding to the R filters and the one first pixel P1 corresponding to the G filter, no second pixels P2 are arranged in regions corresponding to first pixels P1 corresponding to B filters. Since wiring lines or the like can be arranged in the regions, the degree of freedom of the layout of the configuration in the second substrate 20 can be improved.

First Modified Example

Figure 3:
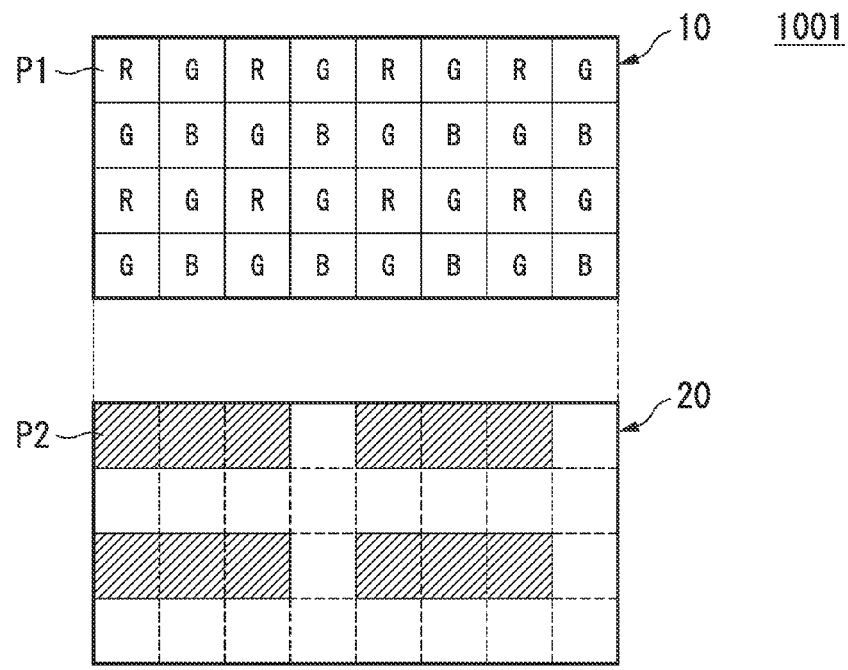
FIG. 3 is a plan view illustrating a configuration example of a solid-state imaging device according to a first modified example of the first embodiment of the present invention.

Next, a modified example of the present embodiment will be described. FIG. 3 illustrates a configuration example of a solid-state imaging device 1001 according to a first modified example. A state where the first substrate 10 and the second substrate 20 are seen in the direction perpendicular to the principal surface of each substrate is illustrated in FIG. 3.

Hereinafter, differences from the solid-state imaging device 1000 illustrated in FIG. 1 will be described. In the solid-state imaging device 1001, three first pixels P1 that are consecutive in a row direction, that is, a horizontal direction, constitute a pixel group. Specifically, two first pixels P1 corresponding to R filters and one first pixel P1 corresponding to a G filter constitute the pixel group. In other words, the pixel group includes only two first pixels P1 corresponding to R filters and one first pixel P1 corresponding to a G filter. A second pixel P2 is arranged corresponding to a set of the plurality of first pixels P1 that constitute the pixel group.

Second Modified Example

Figure 4:
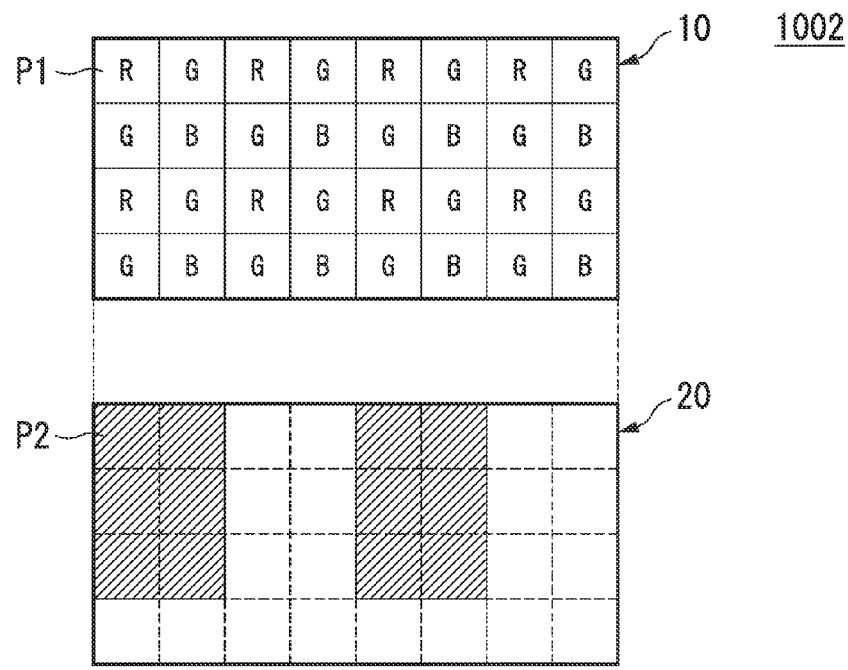
FIG. 4 is a plan view illustrating a configuration example of a solid-state imaging device according to a second modified example of the first embodiment of the present invention.

FIG. 4 illustrates a configuration example of a solid-state imaging device 1002 according to a second modified example. A state where the first substrate 10 and the second substrate 20 are seen in the direction perpendicular to the principal surface of each substrate is illustrated in FIG. 4.

Hereinafter, differences from the solid-state imaging device 1000 illustrated in FIG. 1 will be described. In the solid-state imaging device 1002, six first pixels P1 arranged in an oblong region including two first pixels P1 that are consecutive in the row direction, that is, the horizontal direction, and three first pixels P1 that are consecutive in the column direction, that is, the vertical direction, constitute a pixel group. Specifically, two first pixels P1 corresponding to R filters, three first pixels P1 corresponding to G filters, and one first pixel P1 corresponding to a B filter constitute the pixel group. A second pixel P2 is arranged corresponding to a set of the plurality of first pixels P1 that constitute the pixel group.

Third Modified Example

Figure 5:
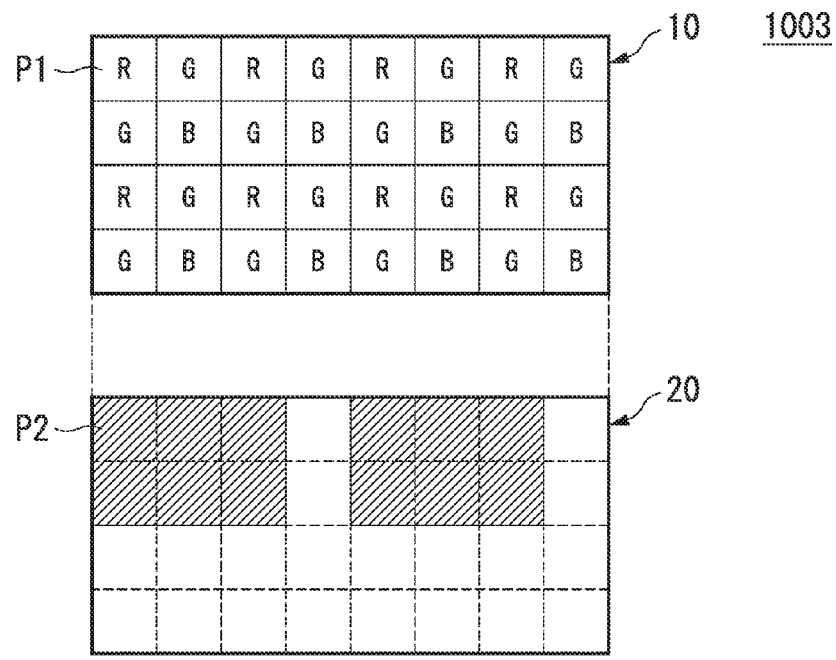
FIG. 5 is a plan view illustrating a configuration example of a solid-state imaging device according to a third modified example of the first embodiment of the present invention.

FIG. 5 illustrates a configuration example of a solid-state imaging device 1003 according to a third modified example. A state where the first substrate 10 and the second substrate 20 are seen in the direction perpendicular to the principal surface of each substrate is illustrated in FIG. 5.

Hereinafter, differences from the solid-state imaging device 1000 illustrated in FIG. 1 will be described. In the solid-state imaging device 1003, six first pixels P1 arranged in an oblong region including three first pixels P1 that are consecutive in the row direction, that is, the horizontal direction, and two first pixels P1 that are consecutive in the column direction, that is, the vertical direction, constitute a pixel group. Specifically, two first pixels P1 corresponding to R filters, three first pixels P1 corresponding to G filters, and one first pixel P1 corresponding to a B filter constitute the pixel group. A second pixel P2 is arranged corresponding to a set of the plurality of first pixels P1 that constitute the pixel group.

Fourth Modified Example

Figure 6:
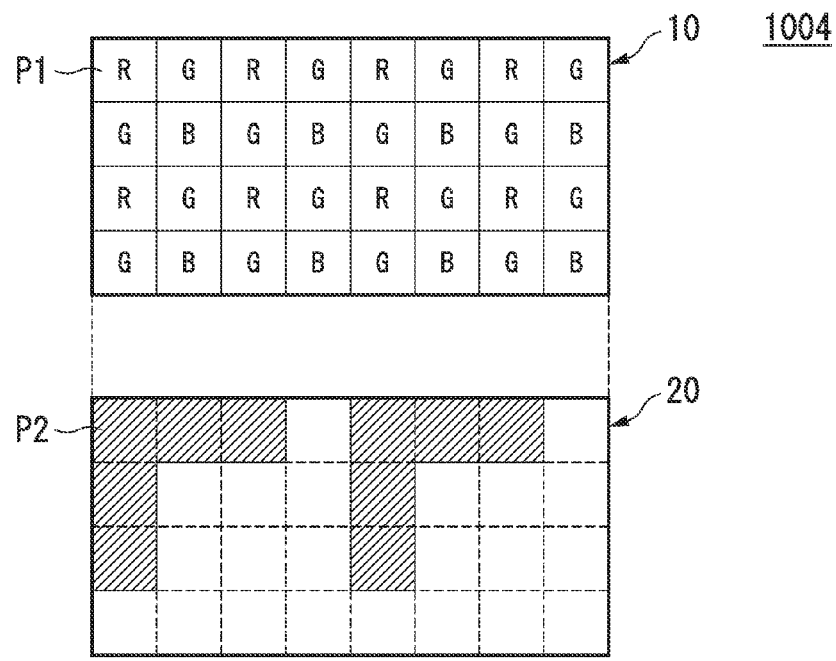
FIG. 6 is a plan view illustrating a configuration example of a solid-state imaging device according to a fourth modified example of the first embodiment of the present invention.

FIG. 6 illustrates a configuration example of a solid-state imaging device 1004 according to a fourth modified example. A state where the first substrate 10 and the second substrate 20 are seen in the direction perpendicular to the principal surface of each substrate is illustrated in FIG. 6.

Hereinafter, differences from the solid-state imaging device 1000 illustrated in FIG. 1 will be described. In the solid-state imaging device 1004, five first pixels P1 constitute a pixel group. Specifically, three first pixels P1 corresponding to R filters and two first pixels P1 corresponding to G filters constitute the pixel group. A second pixel P2 is arranged corresponding to a set of the plurality of first pixels P1 that constitute the pixel group.

In all of the above modified examples, the light, which has been transmitted through a pixel group constituted of a plurality of the first pixels P1 corresponding to the color filters of two or more colors, enters the second photoelectric conversion unit 201 of a second pixel P2 corresponding to the pixel group. Accordingly, the degree of freedom of the layout of the second pixel P2 can be improved.

Additionally, by changing the combination of the first pixels P1 that constitute the pixel group as described above, it is possible to change a region where the second pixel P2 is arranged. Therefore, the degree of freedom of the layout of the second pixel P2 can be improved.

Second Embodiment

Figure 7:
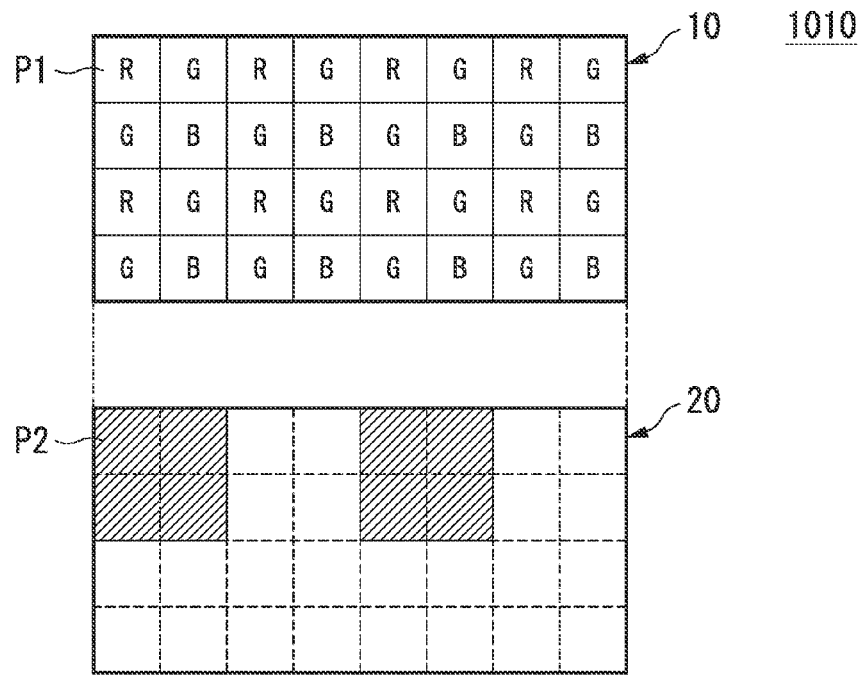
FIG. 7 is a plan view illustrating a configuration example of a solid-state imaging device according to a second embodiment of the present invention.

Next, a second embodiment of the present invention will be described. FIG. 7 illustrates a configuration example of a solid-state imaging device 1010 according to the present embodiment. A state where the first substrate 10 and the second substrate 20 are seen in the direction perpendicular to the principal surface of each substrate is illustrated in FIG. 7.

Hereinafter, differences from the solid-state imaging device 1000 illustrated in FIG. 1 will be described. In the solid-state imaging device 1010, a pixel group includes one or more sets of only four first pixels P1 included in a unit array of a Bayer array. Specifically, the pixel group includes one or more sets of one first pixel P1 corresponding to one R filter, two first pixels P1 corresponding to two G filters, and one first pixel P1 corresponding to one B filter. In FIG. 7, the pixel group includes one set of four first pixels P1 included in the unit array of the Bayer array. That is, the pixel group includes four first pixels P1 of two rows and two columns. A second pixel P2 is arranged corresponding to the set of the plurality of first pixels P1 that constitute the pixel group.

In the present embodiment, the light, which has been transmitted through the pixel group constituted of the plurality of first pixels P1 corresponding to the color filters of two or more colors, enters the second photoelectric conversion unit 201 of the second pixel P2 corresponding to the pixel group. Accordingly, the sensitivity of the second pixel P2 can be improved.

Additionally, by changing the combination of the first pixels P1 that constitute the pixel group, it is possible to change a region where the second pixel P2 is arranged. Therefore, the degree of freedom of the layout of the second pixel P2 can be improved.

Additionally, by constituting the pixel group so as to include one or more sets of the first pixels P1 corresponding to the unit array of the Bayer array, the second pixel P2 corresponding to the pixel group can be easily arranged.

First Modified Example

Figure 8:
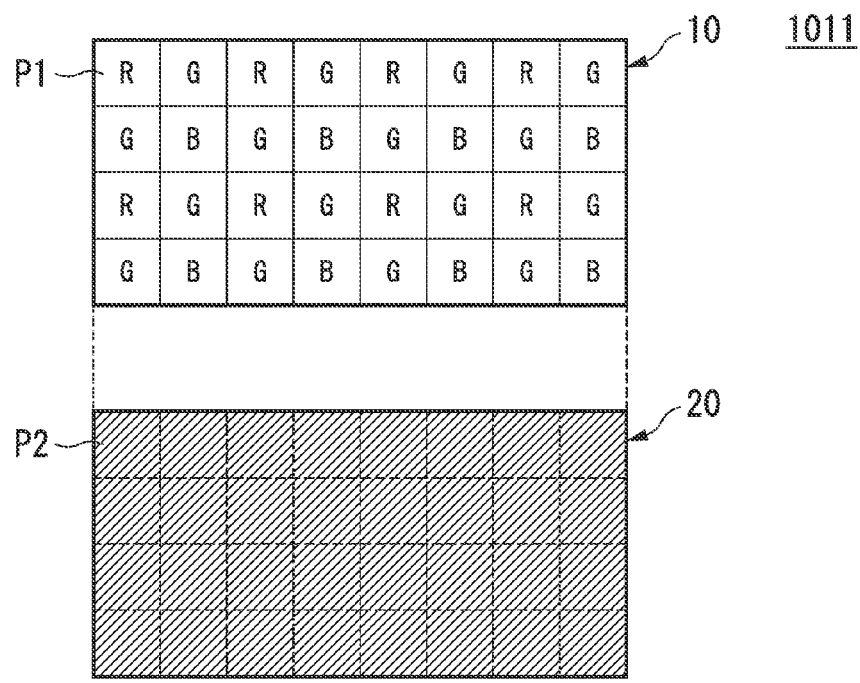
FIG. 8 is a plan view illustrating a configuration example of a solid-state imaging device according to a first modified example of the second embodiment of the present invention.

Next, a modified example of the present embodiment will be described. FIG. 8 illustrates a configuration example of a solid-state imaging device 1011 according to a first modified example. A state where the first substrate 10 and the second substrate 20 are seen in the direction perpendicular to the principal surface of each substrate is illustrated in FIG. 8.

Hereinafter, differences from the solid-state imaging device 1010 illustrated in FIG. 7 will be described. In the solid-state imaging device 1011, the pixel group includes eight sets of four first pixels P1 included in the unit array of the Bayer array. That is, the pixel group includes thirty two first pixels P1 of four rows and eight columns. A second pixel P2 is arranged corresponding to the set of the plurality of first pixels P1 that constitute the pixel group.

Second Modified Example

Figure 9:
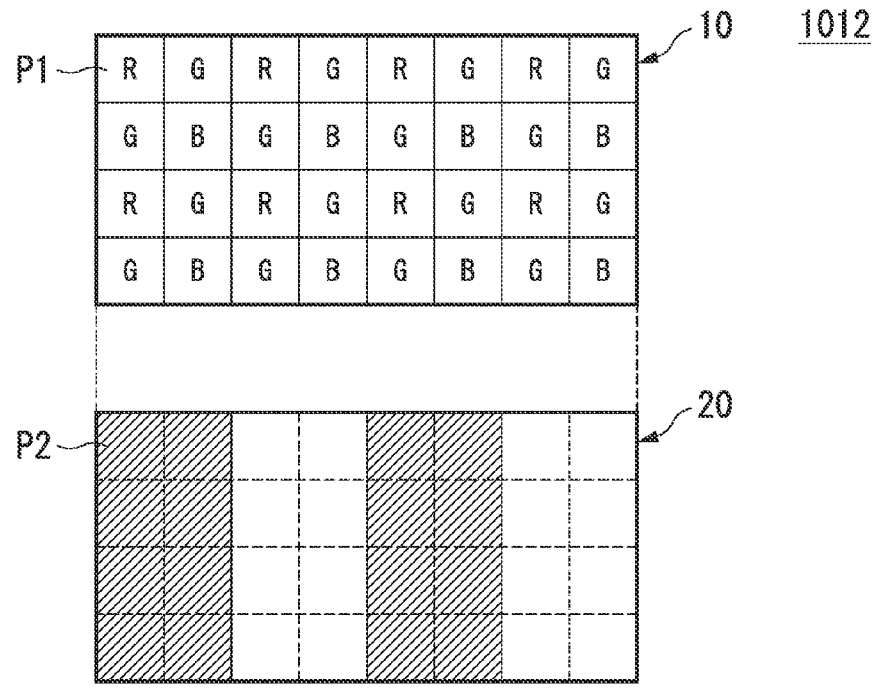
FIG. 9 is a plan view illustrating a configuration example of a solid-state imaging device according to a second modified example of the second embodiment of the present invention.

FIG. 9 illustrates a configuration example of a solid-state imaging device 1012 according to a second modified example. A state where the first substrate 10 and the second substrate 20 are seen in the direction perpendicular to the principal surface of each substrate is illustrated in FIG. 9.

Hereinafter, differences from the solid-state imaging device 1010 illustrated in FIG. 7 will be described. In the solid-state imaging device 1012, the pixel group includes two sets of four first pixels P1 included in the unit array of the Bayer array. That is, the pixel group includes eight first pixels P1 of four rows and two columns. A second pixel P2 is arranged corresponding to the set of the plurality of first pixels P1 that constitute the pixel group.

Third Modified Example

Figure 10:
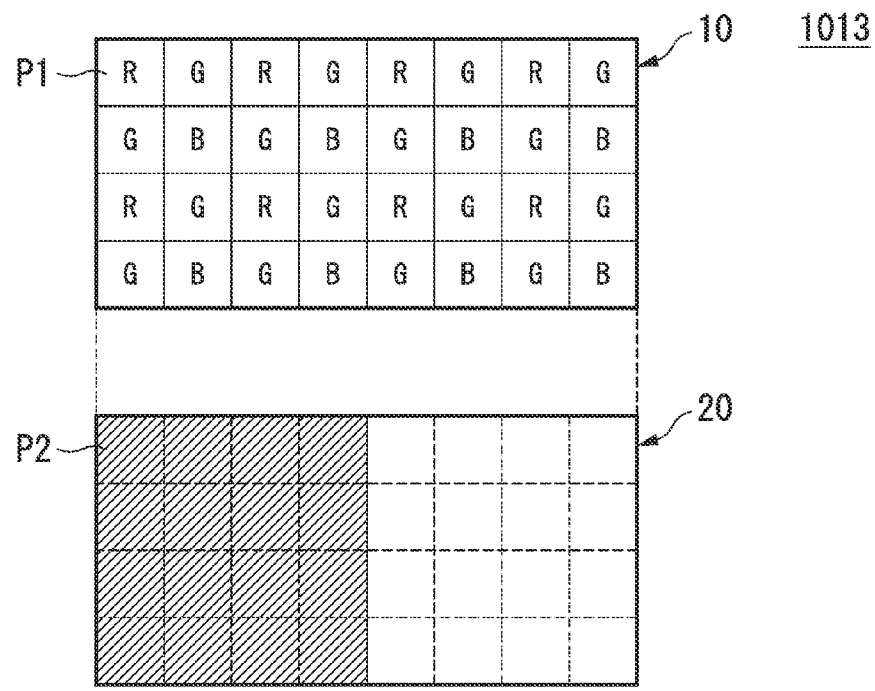
FIG. 10 is a plan view illustrating a configuration example of a solid-state imaging device according to a third modified example of the second embodiment of the present invention.

FIG. 10 illustrates a configuration example of a solid-state imaging device 1013 according to a third modified example. A state where the first substrate 10 and the second substrate 20 are seen in the direction perpendicular to the principal surface of each substrate is illustrated in FIG. 10.

Hereinafter, differences from the solid-state imaging device 1010 illustrated in FIG. 7 will be described. In the solid-state imaging device 1013, the pixel group includes four sets of four first pixels P1 included in the unit array of the Bayer array. That is, the pixel group includes sixteen first pixels P1 of four rows and four columns. A second pixel P2 is arranged corresponding to the set of the plurality of first pixels P1 that constitute the pixel group.

In all of the above modified examples, the light, which has been transmitted through a pixel group constituted of a plurality of the first pixels P1 corresponding to the color filters of two or more colors, enters the second photoelectric conversion unit 201 of a second pixel P2 corresponding to the pixel group. Accordingly, the sensitivity of the second pixel P2 can be improved.

Additionally, by changing the combination of the first pixels P1 that constitute the pixel group as described above, it is possible to change a region where the second pixel P2 is arranged. Therefore, the degree of freedom of the layout of the second pixel P2 can be improved.

Additionally, by constituting the pixel group so as to include one or more sets of the four first pixels P1 corresponding to the unit array of the Bayer array, the second pixel P2 corresponding to the pixel group can be easily arranged.

While preferred embodiments of the present invention have been described, the present invention is not limited to the embodiments. Additions, omissions, substitutions, and other variations may be made to the present invention without departing from the spirit and scope of the present invention. The present invention is not limited by the above description, but by the appended claims.

What is claimed is:
1. A solid-state imaging device comprising:
a first substrate configured such that a plurality of first pixels having first photoelectric conversion units are arranged in a two-dimensional matrix;
a second substrate configured such that a plurality of second pixels having second photoelectric conversion units are arranged in a two-dimensional matrix; and
a plurality of color filters arranged corresponding to each of the first pixels,
wherein a plurality of the first pixels corresponding to the color filters of two or more colors constitute a pixel group,
wherein a plurality of the pixel groups are arranged so that each of the pixel groups corresponds to one of the second pixels,
wherein a light which is transmitted through the color filters enters the first photoelectric conversion units of the first pixels corresponding to the color filters,
wherein a light which is transmitted through the pixel group enters the second photoelectric conversion unit of the second pixel corresponding to the pixel group,
wherein the number of colors of the color filters corresponding to the plurality of first pixels that constitute the pixel group, and the number of the first pixels corresponding to each color are equal to each other among the plurality of pixel groups,
wherein the color filters include:
R filters having a peak of transmittance in a red wavelength band;
G filters having a peak of transmittance in a green wavelength band; and
B filters having a peak of transmittance in a blue wavelength band, and
wherein the pixel group includes two or more of the first pixels corresponding to the R filters.
2. The solid-state imaging device according to claim 1, wherein the R filters, the G filters, and the B filters are arranged so as to constitute a Bayer array, and
wherein the pixel group includes only two of the first pixels corresponding to the R filters and one of the first pixels corresponding to the G filter.
3. The solid-state imaging device according to claim 1, wherein the R filters, the G filters, and the B filters are arranged so as to constitute a Bayer array, and
wherein the pixel group includes two or more combinations of only one of the first pixels corresponding to one of the R filters included in a unit array of the Bayer array, two of the first pixels corresponding to two of the G filters included in the unit array of the Bayer array, and one of the first pixels corresponding to one of the B filters included in the unit array of the Bayer array.

* * * * *